United States Patent
Lamers

Patent Number: 5,262,921
Date of Patent: Nov. 16, 1993

[54] DIRECTLY COOLED CIRCUIT BOARD FOR AN ELECTRONIC POWER CIRCUIT

[75] Inventor: Johannes Lamers, Neuss, Fed. Rep. of Germany

[73] Assignee: Rheinmetall GmbH, Ratingen, Fed. Rep. of Germany

[21] Appl. No.: 775,979

[22] PCT Filed: Oct. 31, 1990

[86] PCT No.: PCT/EP90/01826

§ 371 Date: Nov. 1, 1991

§ 102(e) Date: Nov. 1, 1991

[30] Foreign Application Priority Data

Mar. 3, 1990 [DE] Fed. Rep. of Germany ....... 4010193

[51] Int. Cl.⁵ ................................................ H05K 7/20
[52] U.S. Cl. ............................. 361/699; 165/104.33; 257/714; 361/736
[58] Field of Search ............. 62/418; 165/80.4, 104.19, 165/104.33; 257/705, 714; 361/382, 385, 388, 395, 399

[56] References Cited

U.S. PATENT DOCUMENTS

| | | | |
|---|---|---|---|
| 3,956,673 | 5/1976 | Seid | 361/415 |
| 4,053,942 | 10/1977 | Dougherty, Jr. et al. | |
| 4,547,834 | 10/1985 | Dumont | 361/386 |
| 4,706,164 | 11/1987 | L'Henaff et al. | |
| 4,739,443 | 4/1988 | Singhdeo | 361/382 |
| 4,893,590 | 1/1990 | Kashimura | 123/41.31 |

FOREIGN PATENT DOCUMENTS

| | | |
|---|---|---|
| 0348018 | 6/1978 | Austria . |
| 0014249 | 8/1980 | European Pat. Off. . |
| 0197817 | 10/1986 | European Pat. Off. . |
| 3206059 | 11/1984 | Fed. Rep. of Germany . |
| 0246441 | 6/1987 | German Democratic Rep. . |

OTHER PUBLICATIONS

IBM Tech Discl Bull vol. 27 No. 9 Feb. 1985, p. 5286 "Block Cooling—Dissipation", Gruber et al.

*Primary Examiner*—Gerald P. Tolin
*Attorney, Agent, or Firm*—Spencer, Frank & Schneider

[57] ABSTRACT

In order to improve the cooling of one sided circuit boards for electronic power circuits in SMD configuration, the surface (14) of the circuit board (10) which is not provided with circuit components is part of the interior wall of a housing (26) through which flows a liquid coolant and which is equipped with inlet and outlet pipe connections (28, 30) for conduits through which flows a coolant. In order to remove heat, the side (14) of the circuit board (10) which is not provided with the circuit components can be directly wetted with coolant.

8 Claims, 1 Drawing Sheet

DIRECTLY COOLED CIRCUIT BOARD FOR AN ELECTRONIC POWER CIRCUIT

BACKGROUND OF THE INVENTION

The invention relates to a one sided circuit board for an electronic power circuit in SMD (surface mounted device) configuration.

Prior art circuit boards for electronic power circuits of this type are configured so that, in order to dissipate the resulting heat, either the entire circuit board or all circuit components involved in the development of excessive heat are mounted on cooling bodies. If power consumption is high, for example 250 W and more, such circuit boards and/or the cooling bodies must additionally be cooled by means of a fan. As a whole, this undesirably increases the structural volume required for such electronic power circuits.

SUMMARY OF THE INVENTION

It is therefore the object of the invention to provide a circuit board for an electronic power circuit in SMD configuration which, while avoiding the above-mentioned drawbacks, ensures sufficient good cooling in spite of its small structural configuration even with high power consumption.

The above object generally is accomplished according to the invention by a novel arrangement of a one-sided circuit board for an electronic power circuit in SMD configuration. More particularly, the above object is achieved according to the present invention by an arrangement which comprises a circuit board having first and second opposed surfaces formed of one of a steel substrate and a ceramic material substrate, an electronic power circuit in a surface mounted device configuration disposed on only the first surface of the circuit board, and a housing through which a liquid coolant flows which is and which is provided with inlet and outlet pipe connections for a liquid coolant, with the second surface of the circuit board forming at least a portion of an interior surface of a wall of the housing.

The integration, according to the invention, of the circuit board itself in a housing through which flows a liquid coolant brings about the great advantage of permitting simple and possibly even pressure-free liquid cooling of the circuit board. In particular, if the circuit board according to the invention is employed in machines which are equipped with a liquid circulating system, for example washing machines (water supply), ultrasonic washers and automobiles (radiator circulation), the circuit board according to the invention can be very easily integrated in the path of the circulating liquid as the cover of an already existing housing. In such cases, the additional space requirement, if any, for the circuit board according to the invention is very little, particularly when compared to the cooling bodies and/or fans required in the past.

As an advantageous feature of the invention, it is further provided that the circuit board according to the invention is configured in the form of a known hybrid board so that a very high mechanical strength can be realized for the circuit board and it can be adapted in this way, as part of a housing through which a coolant flows, to the mechanical strengths applicable for the housing.

Such a circuit board according to the invention in hybrid configuration can be manufactured in almost all conceivable shapes by means of known manufacturing processes and can be employed in the form of a cover or in a similar way on almost any housing shape, for example on rectangular, box-shaped, tubular or triangular housings or on shapes derived therefrom.

As a particular feature of the invention it is further provided that a further circuit for monitoring and determining its temperature and for controlling and regulating the coolant stream is provided on the circuit board according to the invention in addition to the electronic power circuit. In this way, it is possible in a simple manner to regulate and adapt the flow of coolant, as a function of the power consumption and the heat inevitably developed thereby, to the amount of heat necessary to be removed.

Further advantageous features of the invention are defined in the dependent claims.

BRIEF DESCRIPTION OF THE DRAWINGS

The invention will be described below and explained in detail with reference to the drawings wherein.

DETAILED DESCRIPTION OF THE PREFERRED EMBODIMENTS

Figure 1:
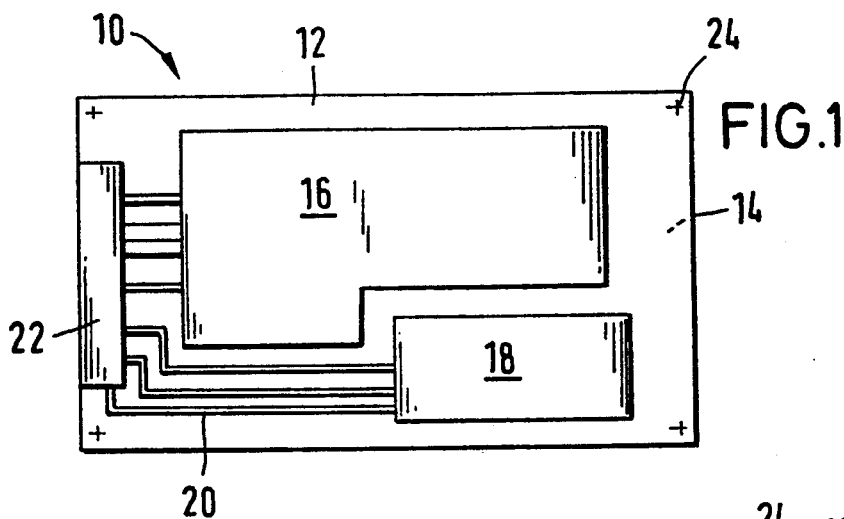
FIG. 1 is a schematic plan view of an embodiment of a circuit board according to the invention.

FIG. 1 shows the embodiment of a unilaterally equipped i.e., one-sided circuit board 10 according to the invention which includes an electronic power circuit 16 and a further circuit 18 for determining and monitoring the circuit board temperature (and for determining the temperature of a coolant) and for controlling subsequently connected adjustment members. As shown, the circuits 16 and 18 are connected via printed circuit paths 20 to a connector 22.

The electronic configuration of such circuits 16, 18 is familiar to the person skilled in the art; they are configured in a known manner as printed circuits in SMD configuration. For the sake of simplicity, circuits 16, 18 are therefore shown only schematically.

Due to the SMD configuration and design of circuit board 10 there results an equipped or circuit bearing side or surface 12, and an unequipped or non-circuit bearing side or surface 14 of the circuit board 10, with the latter being possibly exposed directly to the coolant stream.

Preferably, if more strength is required, circuit board 10 is manufactured as a hybrid card, with circuit board 10 being composed, depending on the intended application, of a metal containing material, for example, a steel substrate provided with a layer of insulating material on the surface 12 or of a ceramic material.

In order to releasably fasten circuit board 10, screws are provided in the embodiment shown here whose position on circuit board 10 is indicated by the screw center points marked 24. Of course, other ways of fastening circuit board 10 are also conceivable without limiting the scope of the invention, including non-removable types of fastening, such as, for example, by gluing.

Figure 2:
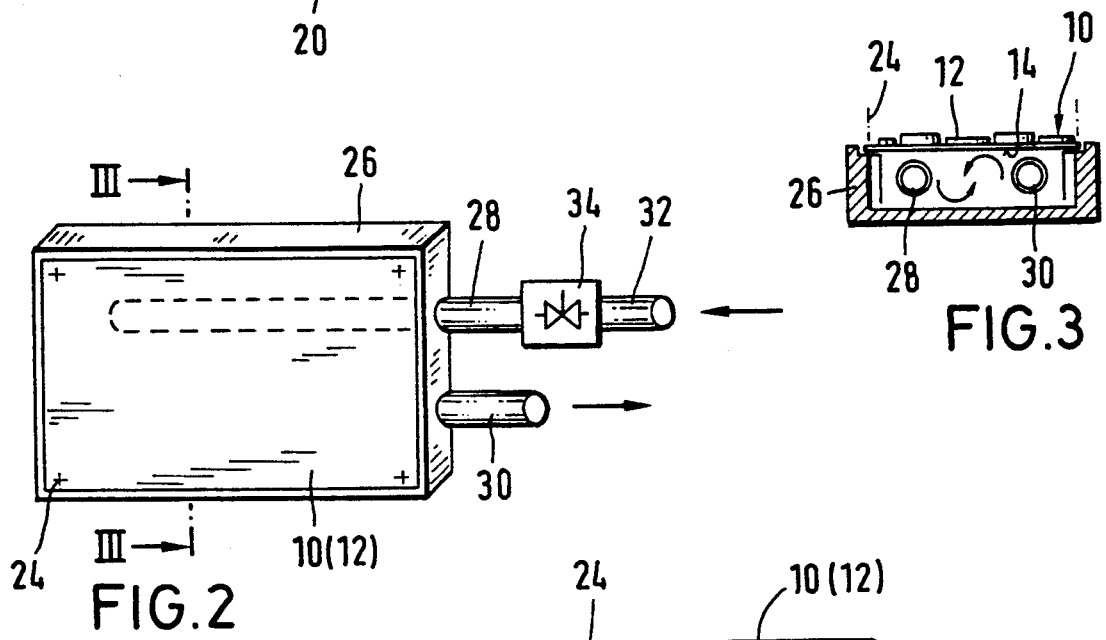
FIG. 2 is a side view of a rectangular, box-shaped housing including a circuit board according to FIG. 1 as the cover.

FIG. 2 shows a rectangular, box-shaped housing 26 through which flows a liquid coolant and in which the inventive circuit board 10 of FIG. 1 is used as the cover of a long side or part thereof. The liquid coolant, not shown in detail here, for example water or oil, enters housing 26 through an inlet pipe connection marked 28, circulates within housing 26 and leaves housing 26 through an outlet pipe connection marked 30. In order to impart better turbulence to the coolant within housing 26, inlet pipe connection 28 is preferably configured, as shown in FIG. 2, as an elongate tube that extends into housing 26. Circuit board 10, of which again only the equipped side 12 is visible in FIG. 2, is releasably connected with housing 26, for example by means of screws 24. The coolant flows directly against the unequipped side 14 of the circuit board. Of course, without limiting the scope of the invention, baffle webs or guide zones for changing the direction of flow of the coolant may also be provided in housing 26 itself in order to improve turbulence in the coolant.

To set the desired quantity of coolant flowing through the box-shaped housing 26, a flow quantity regulator 34, preferably an electrically adjustable flow quantity regulator, is provided between the inlet pipe 28 and a coolant conduit 32. By way of connections, not shown in detail here, this flow quantity regulator 34 may be electrically actuated by a temperature determination and monitoring circuit 18 provided on circuit board 10 (see FIG. 1 in this connection).

Such electrically controllable flow quantity regulators 34 are known to the person skilled in the art and are not part of the invention. Without limiting the invention it is also conceivable to effect the actual temperature determination and monitoring by way of a suitably configured temperature sensor within housing 26 and to limit temperature determination and monitoring circuit 18 (see FIG. 1) to a purely comparison and control function.

Figure 3:
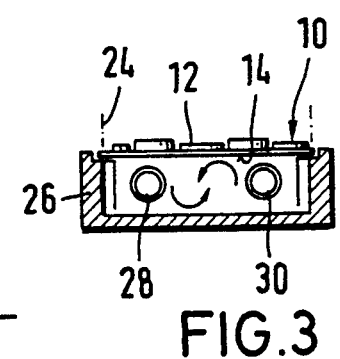
FIG. 3 is a sectional view of the housing of FIG. 2 seen approximately at the level of the marking indicated as III—III in that figure.

FIG. 3 is a sectional view of the box-shaped housing 26 of FIG. 2 approximately at the height of the line marked III—III in FIG. 2. Maintaining the above-mentioned reference numerals, the illustrated individual components in their association serve to clarify the attachment and function of the circuit board 10 according to the invention. Clearly visible in FIG. 3 is the actual circuit board 10 and its unequipped side 14 against which flows, as a result of turbulence formation, the liquid coolant that has entered into housing 26 through inlet pipe connection 28.

If circuit board 10 is made of a corrosion sensitive, metal containing material, its unequipped side 14 is preferably provided with a thin corrosion protection coating.

As already mentioned, circuit board 10 is fastened in or to housing 26 by means of screws 24 so that it is easy to exchange circuit board 10. Of course, a known seal, for example, a continuous O-ring in an appropriate groove, is provided between circuit board 10 and a continuous collar, here not identified in detail, of housing 26 on which circuit board 10 rests.

Figure 4:
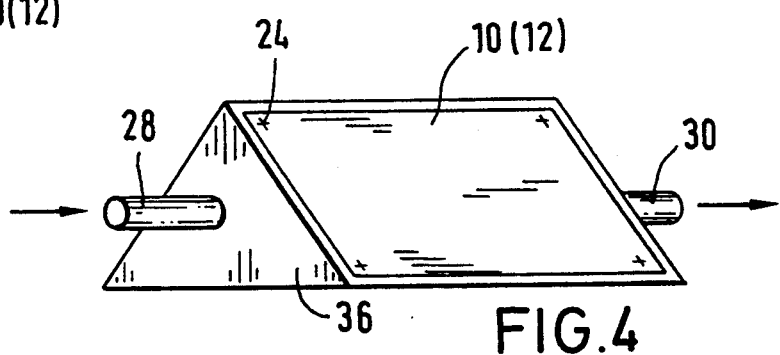
FIG. 4 shows a housing having a triangular cross section and equipped with a circuit board according to FIG. 1 as cover.

FIG. 4 shows a further hollow housing 36 which has an essentially triangular cross section and in which, corresponding to the box-shaped housing 26 shown in FIG. 2, the circuit board 10 according to the invention is employed as the cover on one long side. Circuit board 10, of which here again only the equipped side 12 is visible, is again connected with housing 36, for the sake of simplicity, by means of screws 24. As another feature of the invention, the inlet pipe connection 28 for the liquid coolant in the housing shown in FIG. 4 is disposed in the one end face and the outlet pipe connection 30 is disposed in the opposite end of the housing 36. Preferably, inlet pipe connection 28 and outlet pipe connection 30 are not arranged so as to be axially aligned with one another. In that way, both pipe connections 28, 30 can open into the interior of housing 36, individually—as shown in FIG. 2 for the example of inlet pipe connection 28—as extended tubes. As in FIG. 2, this measure serves to provide better turbulence for the liquid coolant within housing 36.

Additionally, the statements made above for housing 26 (FIGS. 2 and 3) apply accordingly here.

Figure 5:
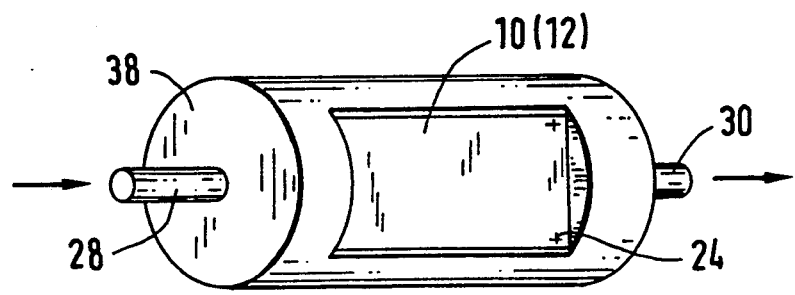
FIG. 5 shows a tubular housing including a circuit board according to FIG. 1.

To further illustrate the many possible uses for the circuit board 10 according to the invention, FIG. 5 shows an essentially closed-end tubular housing 38 provided with an inlet pipe connection 28 and an outlet pipe connection 30 in its respective opposite end surfaces and wherein circuit board 10 covers and seals a correspondingly configured recess, not identified in detail here, in the wall of housing 38. For this embodiment of FIG. 5 as well, the statements made above in connection with the description of FIGS. 1 to 4 apply accordingly.

In practical tests it has already been found that the circuit board according to the invention can be easily integrated as part of a housing of any desired configuration in an existing circulating system for a liquid employed as coolant regardless of the shape of the housing. The invention is distinguished by economical manufacture, small structure, low weight and easy installation. Moreover, the invention can be employed together with economical, commercially available housings which can be easily integrated in existing coolant circuits or, if the circuit board is given a special configuration, the invention can replace covers or corresponding components of housings or parts thereof existing within the circulating system.

I claim:

1. An arrangement comprising: a circuit board having a first circuit bearing surface and a second opposed non-circuit bearing surface formed of one of a steel and a ceramic substrate having a good thermal conductivity; an electronic power circuit in a surface mounted device configuration disposed on only said first surface of said circuit board; and a housing having an interior through which a liquid coolant flows and being provided with inlet and outlet pipe connections for a liquid coolant, with said second surface of said circuit board forming at least a portion of an interior surface of a wall of said housing which is directly contacted by flowing liquid coolant.

2. An arrangement according to claim 1 wherein said circuit board comprises a steel substrate.

3. The arrangement according to claim 1 wherein the circuit board is formed of a ceramic material.

4. The arrangement according to claim 1 wherein the circuit board is the cover of an essentially rectangular, box-shaped housing.

5. The arrangement according to claim 1 wherein the circuit board is the cover of a housing having an essentially triangular cross section.

6. The arrangement according to claim 1 wherein the circuit board is the cover of a housing having an essentially tubular cross section.

7. The arrangement according to claim 2, wherein said second surface of the circuit board is provided with a corrosion protection coating.

8. The arrangement according to claim 1 wherein, in addition to the electronic power circuit, said first surface of the circuit board is provided with a further circuit for monitoring and determining the temperature of the circuit board and for controlling means for regulating the flow of liquid coolant through the housing.

* * * * *